United States Patent [19]

Hudson, Jr. et al.

[11] 4,117,398

[45] Sep. 26, 1978

[54] METHOD AND APPARATUS FOR MEASURING THE FILLING EFFECTIVENESS OF A CABLE DURING FILLING

[75] Inventors: James Alphus Hudson, Jr., Atlanta; Raymond Alexander Levandoski, Doraville; Allen Kyle Long, Roswell, all of Ga.

[73] Assignee: Western Electric Company, Inc., New York, N.Y.

[21] Appl. No.: 737,752

[22] Filed: Nov. 2, 1976

Related U.S. Application Data

[63] Continuation-in-part of Ser. No. 642,852, Dec. 22, 1975, abandoned.

[51] Int. Cl.$^2$ .......................................... G01R 27/26
[52] U.S. Cl. ................................. 324/61 R; 156/48; 264/40.2; 324/60 CD; 324/52; 324/54; 427/8
[58] Field of Search ............... 324/61 R, 60 CD, 54, 324/52; 264/40.2; 156/48; 427/8

[56] References Cited

U.S. PATENT DOCUMENTS

| | | | |
|---|---|---|---|
| 3,159,786 | 12/1964 | Bayne | 264/40.2 X |
| 3,288,895 | 11/1966 | Windeler | 264/40.2 |
| 3,433,858 | 3/1969 | Bauer et al. | 264/40.2 |
| 3,459,851 | 8/1969 | MacPherson | 264/40.2 |
| 3,748,577 | 7/1973 | Jones, Jr. | 324/61 R |
| 3,824,459 | 7/1974 | Uchida | 324/60 CD |
| 3,864,626 | 2/1975 | MacLean et al. | 324/61 R |
| 3,879,660 | 4/1975 | Piso | 324/61 R |
| 3,914,357 | 10/1975 | Cereijo et al. | 324/61 R X |
| 4,032,841 | 6/1977 | Knippelmier | 324/60 CD |
| 4,040,041 | 8/1977 | Hruby et al. | 324/60 CD X |

Primary Examiner—Stanley T. Krawczewicz
Attorney, Agent, or Firm—D. P. Kelley

[57] ABSTRACT

The invention relates to the monitoring of the filling effectiveness during the filling operation of a waterproof or filled telecommunications cable on a manufacturing line, and includes measuring the capacitance change per unit length of an outer pair of insulated conductors in the cable, measuring the capacitance change per unit length of an inner pair of insulated conductors in the cable, determining any deviations in the measured capacitance changes and utilizing such deviations by feedback control to eliminate further deviation, as well as determining the point of deviation along the cable length.

11 Claims, 7 Drawing Figures

FIG. 2

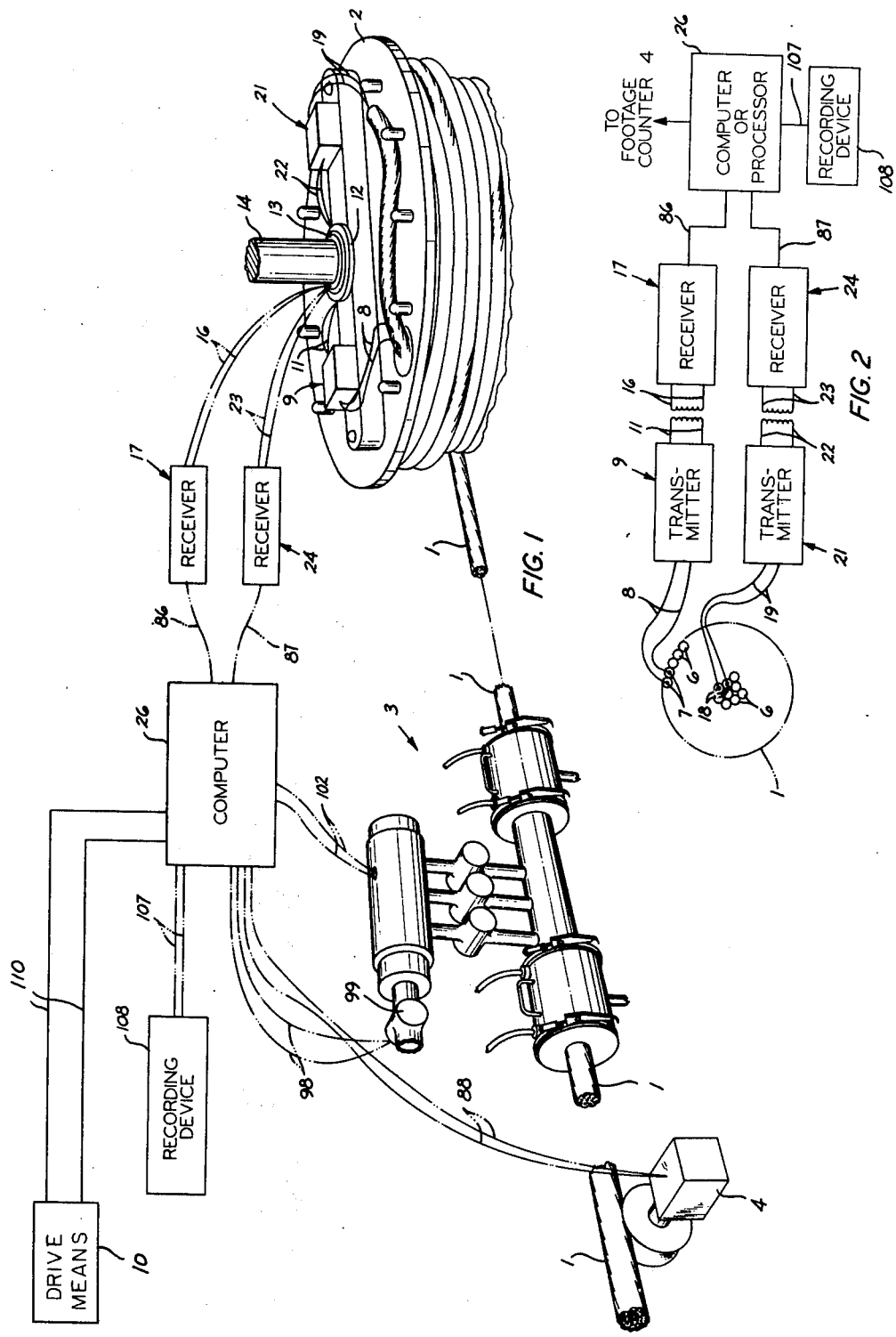

METHOD AND APPARATUS FOR MEASURING THE FILLING EFFECTIVENESS OF A CABLE DURING FILLING

RELATED APPLICATION

This is a continuation-in-part of application Ser. No. 642,852, filed Dec. 22, 1975 now abandoned.

BACKGROUND OF THE INVENTION

1. Field of the Invention

This invention relates to method and apparatus for measuring the filling effectiveness of the filling operation in the manufacture of waterproof cables, wherein the capacitance between an outer pair of conductors is measured and the capacitance between an inner pair of conductors is measured, and the capacitances are compared.

2. Description of the Prior Art

Telecommunications cables, especially those that are to be buried in the ground, are desirably moisture proofed to prevent transmission difficulties resulting from the seepage of moisture into the cable. In general, such moisture proofing is accomplished during manufacture of the cable by filling the internal volume of the cable with a suitable filling compound, such as, for example, petrolatum or a mixture of petrolatum and polyethylene. For the desired results to be achieved, the filling material should preferably occupy substantially all of the volume of the cable that is unoccupied by the conductors and other components therein, including the interstices between twisted pairs of conductors. Various methods and apparatus for filling cables are shown, for example, in U.S. Pat. Nos. 3,832,215, 3,854,444, and 3,850,139 of Franke et al., 3,789,099 and 3,876,487 of Garrett et al., 3,733,225 of Moody, and in copending U.S. Pat. application Ser. No. 457,877 of Freeman et al., filed Apr. 4, 1974, and assigned to the present assignee, now abandoned.

The normal filling procedure involves the introduction of the filling compound after the core has been formed and before the final binder and sheath are placed on the core. At this stage of manufacture, the core is relatively compact and it is difficult to introduce the filling compound, yet the prevention of the ingress of moisture in subsequent use requires that there be a high percentage of fill in the total fillable volume, preferably evenly distributed throughout the cable cross-section.

Numerous arrangements for ascertaining the amount or percentage of fill material in a cable, which is an indication of filling operation effectiveness, have been devised. One such arrangement comprises cutting off an end portion of a finished cable and subjecting one end thereof to water under a known pressure. If more than a predetermined amount of water flows out of the other end, the cable is unacceptable. Another arrangement comprises weighing a short length of filled cable. Since the unfilled weight is known, and the weight of the proper amount of fill material for such a length can be determined, the weight of the filled length of cable should at least equal the sum of the two to be acceptable.

Still another method for determining the acceptability of the filled cable comprises measuring the capacitance of a number of pairs of outer conductors in a finished cable, then measuring the capacitance of a number of pairs of inner conductors, and comparing the two measurements. The difference between the two measurements, divided by the outer measurement provides a measure of the filling effectiveness which can then be compared to empirically predetermined values to ascertain whether or not the cable is acceptable.

In the prior art methods of determining filling effectiveness, examples of which are given in the foregoing, the operations are performed on a finished cable, hence if the filling effectiveness is found to be inadequate, a whole cable run must be scrapped or attempts made to refill the cable. In those processes where the measurements or tests are made on a short length of cable, there is no way of determining whether the remainder of the cable is the same as the tested sample, hence a calculated risk is taken in depending on the test results. In those arrangements where the entire cable length is tested, as in the capacitance measuring method, an indication of non-acceptability may result from only a very short faulty length of cable, which could be cut out if its location along the cable length were known.

This latter problem is common to virtually all of the prior art arrangements, namely, there is no way of ascertaining where, along the cable length, the amount of fill has fallen below an acceptable minimum. An additional drawback of prior art testing methods is that they are performed on finished cables, and unacceptable cables must be scrapped or refilled, which entails both extra time and money.

SUMMARY OF THE INVENTION

The foregoing problems are overcome by the method and apparatus of the present invention, wherein the method includes the steps of continuously monitoring the change in capacitance of an outer pair of conductors as the cable passes through the filling stage; continuously monitoring the change in capacitance of an inner pair of conductors as the cable passes through the filling stage; comparing the monitored changes in capacitance with each other to ascertain the filling effectiveness of the filling operation; and providing an indication of the location along the cable length of points or regions where deviations in filling effectiveness occur.

By means of the foregoing steps, the location of unacceptable regions of fill are pinpointed, which regions result from a drop or decrease in filling effectiveness of the filling operation. Filling effectiveness, in this context, is simply the ratio of volume actually filled to total fillable volume, or, in terms of cross-section, the ratio of actual distribution of fill in the cross-sectional area to total fillable cross-section.

Because of the continuous monitoring of the capacitance change as embodied in the foregoing steps, it is possible, utilizing the present invention, to control the filling operation to remedy defects in the operation and virtually assure maintenance of acceptable filling effectiveness during the manufacturing run. Thus, the method of the invention may include the additional steps of generating control signals in response to deviations in filling effectiveness to vary a parameter of the filling operation to correct such deviations. These parameters include the temperature and pressure of the filling compound, and the line speed of the moving cable as it passes through the filling stage.

DESCRIPTION OF THE DRAWINGS

The invention, and its mode of operation, will be more fully understood by reference to the following detailed description and to the drawings, in which:

FIG. 1 illustrates a portion of the cable core, filling equipment, a footage counter, and monitoring equipment is schematic form;

FIG. 2 illustrates the monitoring equipment in diagrammatic form and the interconnections with the cable core;

DETAILED DESCRIPTION OF THE INVENTION

Figure 3:
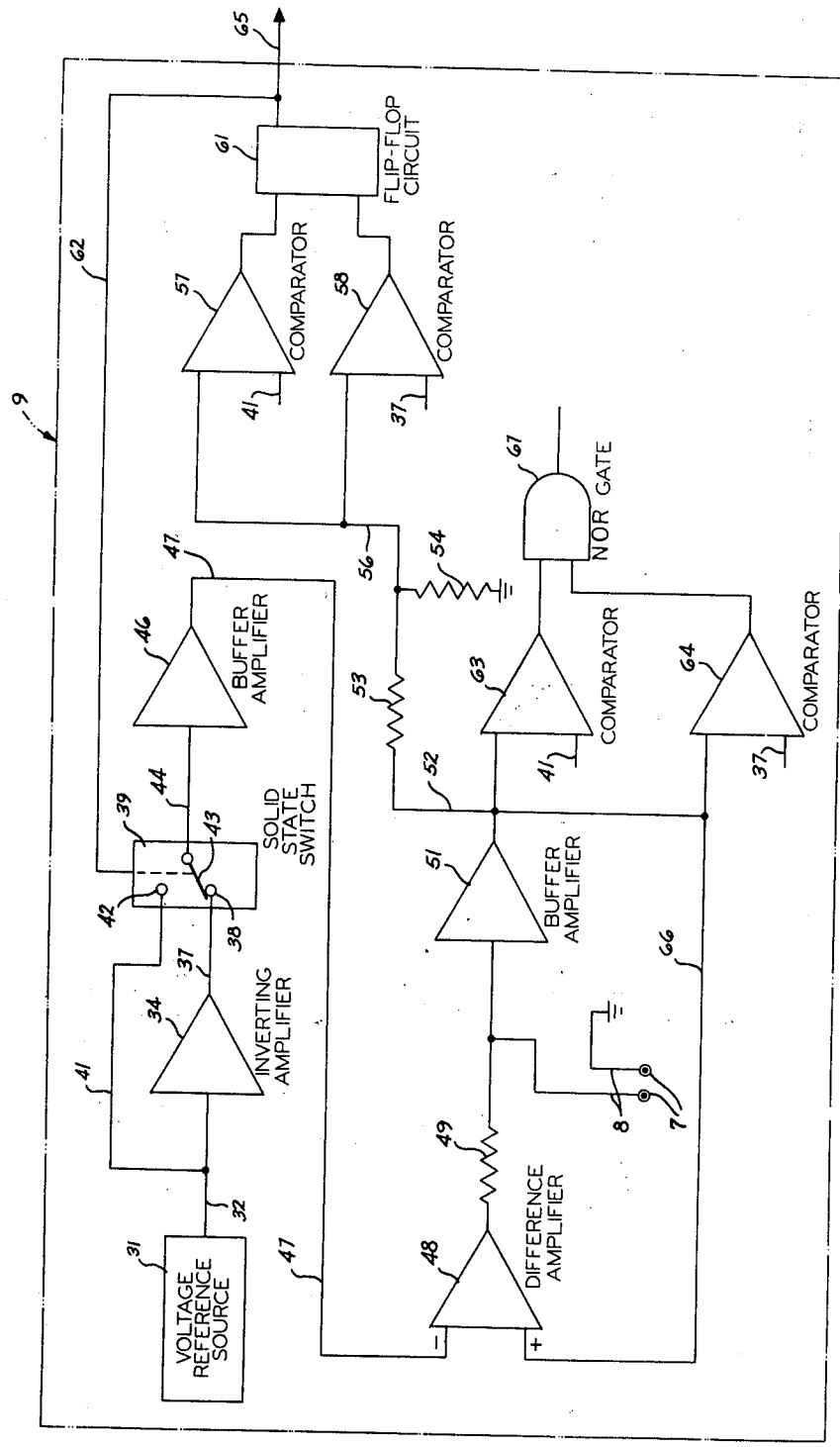
FIG. 3 illustrates capacitance measuring circuitry.

With reference to FIG. 1, there is shown a portion of a cable core 1, the major portion of which is shown on a pay-off reel 2, which is rotatable on a shaft 14. The core 1 is shown passing through a filling chamber, indicated generally by the numeral 3, and which is of the type described in copending U.S. application Ser. No. 457,877, referred to previously. The core 1 advances from the filling chamber 3, over a footage counter 4, and is then taken up on a take-up reel, not shown, which is driven by suitable drive means 10. Between the filling chamber 3 and the footage counter 4 various other manufacturing operations may take place, such as a final binder spirally applied to the core, an aluminum sheath applied over the binder, and an insulating jacket extruded over the sheath, none of which are shown, but all of which are well known operations in the manufacture of telecommunications cables.

In FIGS. 1 and 2, it may be seen that the cable core 1 includes, in this embodiment, a plurality of twisted pairs of insulated conductors 6. An outer twisted pair of conductors 7 are connected in any suitable manner, as, for example, by alligator clips to a pair of leads 8 and by them to the input of a capacitance measuring circuit, encoder, and transmitter, which is indicated generally as block 9, and which is disclosed in detail in FIGS. 3 and 4. The circuitry of block 9 is connected by output leads 11 to an input coupling coil 12, which is rotatable with the reel 2.

The input coupling coil 12 is associated with an output coupling coil 13, which is stationary on the shaft 14. The coil 13 is connected by leads 16 to a receiver and decoder which is indicated generally as the block 17, and which is disclosed in detail in FIG. 4.

Figure 4:
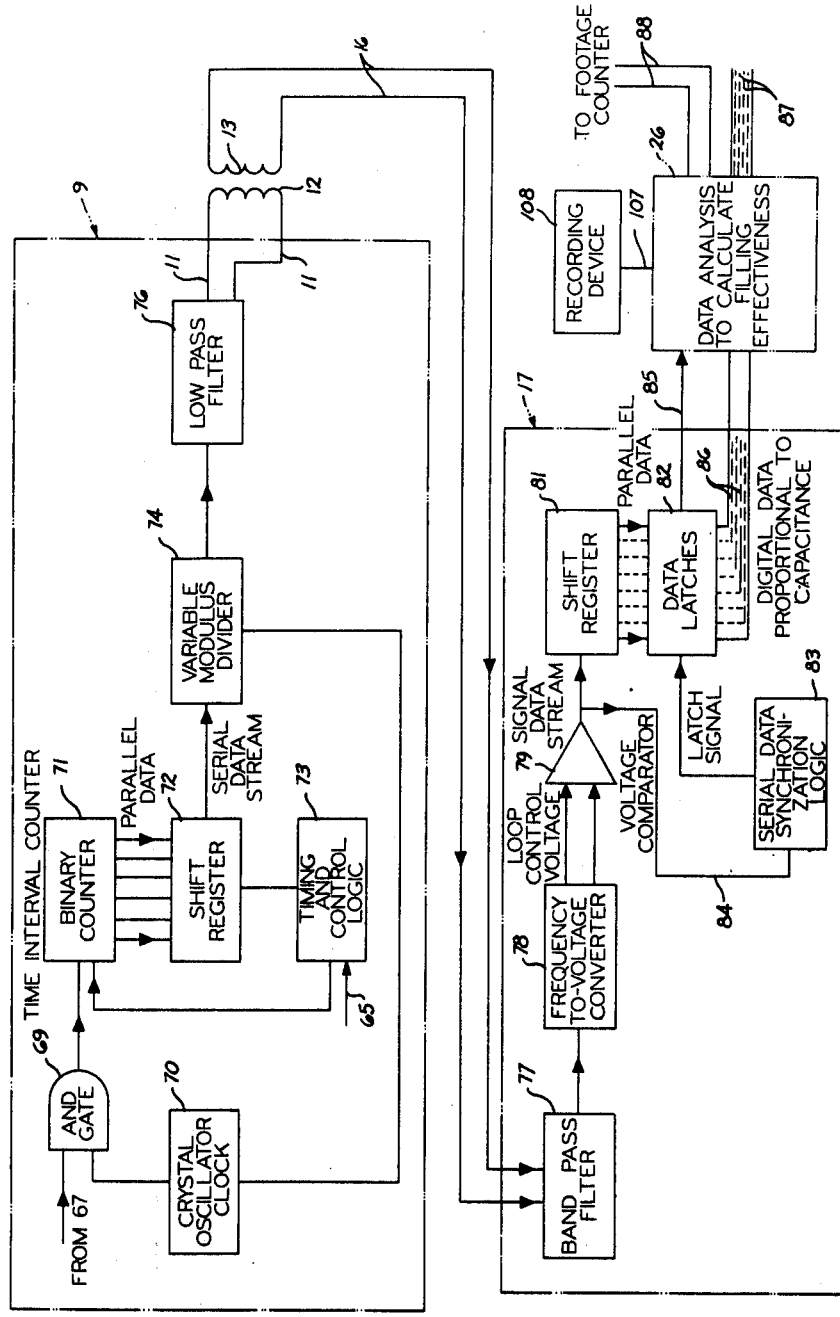
FIG. 4 illustrates encoder circuitry, a transmitter and receiver and decoding circuitry utilized in practicing the invention.

In a similar manner, an inner twisted pair of insulated conductors 18 (see FIG. 2) are connected in any suitable manner, as, for example, by alligator clips to a pair of leads 19 and by them to the input of a capacitance measuring circuit, encoder, and transmitter, which is indicated generally as the block 21, and which is similar to the circuitry disclosed in the block 9 in FIGS. 3 and 4. The circuitry of block 21 is connected by output leads 22 to the rotatable coupling coil 12, described previously. The signals from the leads 22 are coupled through the coil 12 to the stationary coupling coil 13, and through leads 23 to a receiver which is indicated generally as the block 24, and which is similar to that disclosed in detail in the block 17 in FIG. 4.

It may be further seen that the outputs of the receivers 17 and 24 are fed to a computer or processor 26, which could be a general purpose digital computer, for a purpose to be described in detail subsequently.

The capacitance monitoring circuitry contained in the blocks 9 and 17 and depicted in FIGS. 3 and 4 represents an arrangement for achieving a high degree of accuracy in the monitoring process. It is to be understood, however, that other circuit arrangements for monitoring capacitance changes might also be used, depending upon the degree of accuracy and speed of response desired. While the following description is directed to the circuits of blocks 9 and 17 for monitoring the capacitance change between the conductors 7, substantially identical circuitry is represented by blocks 21 and 24 for monitoring the capacitance change between the conductors 18. Because coils 12 and 13 are common to both monitoring branches, the circuitry of blocks 21 and 24 operates at different frequencies from that of blocks 9 and 17.

As the filling operation progresses, the mutual capacitance of the pair of conductors 7 will increase because the air between conductors 7, which has a dielectric constant of 1.0, is replaced by the filling compound, which has a dielectric constant materially different from that of air, such as, for example, 2.2. In addition, as the filled length of the cable core increases, the capacitance also increases as a function of length. The monitoring equipment is operated on the principle that under routine operating conditions, the outer pair of conductors 7 will be approximately 100% surrounded with the filling compound because they are at the outside of the cable core 1 as it passes through the filling chamber 3.

In the circuit of FIG. 3, a voltage reference source 31 generates an output, preferably direct current, such as a positive 5 volts, which is applied to an inverting amplifier 34 via lead 32, and to one contact 42 of a single pole-double throw switch 39. The output of amplifier 34 is applied by lead 37 to the other contact 38 of switch 39. Switch 39 may take any of a number of suitable forms, such as, for example, a solid state device. The voltages applied to contacts 42 and 38 are depicted in FIG. 5 as 33 and 36, respectively.

Contactor 43 of switch 39 applies either the positive (33) or negative (36) reference voltage to a buffer amplifier 46 via lead 44. As will be apparent hereinafter, a waveform such as 45 in FIG. 5 can be made to appear on lead 44 and the output lead 47 of amplifier 46 by a periodic actuation of switch 39. The output of amplifier 46 is applied to the negative input of a difference amplifier (constant current generator) 48, the output of which is applied through a charging resistor 49 to the conductors 7, the capacitance between which is then charged (and discharged). Amplifier 48 adds a small amount of gain to the reference voltage input so that the capacitance can be charged to voltages either higher or lower than the positive and negative reference voltages, respectively.

The charging (and discharging) of the capacitances is monitored by a buffer amplifier 51, which serves to isolate the capacitance charging circuitry from the loading effects of other parts of the circuit. The output of amplifier 51, represented by curve 55 in FIG. 5, is applied via lead 66 to the plus or positive input of amplifier 48 so that, as the amplifier 48 monitors the difference between its two voltage inputs it provides through resistor 49 a constant current charging or discharging of the capacitance of the conductors 7.

Figure 5:
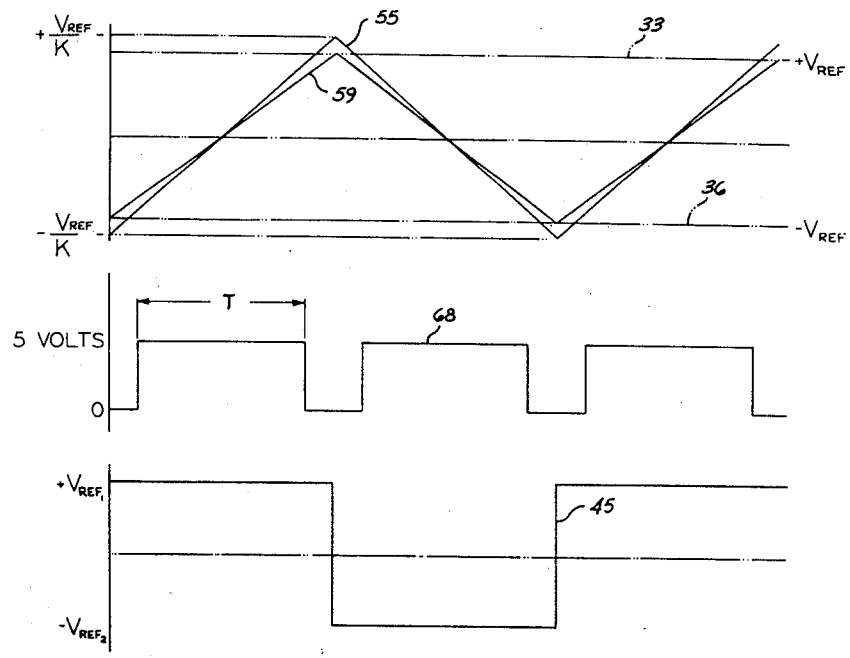
FIG. 5 illustrates waveforms which are present at various points in the measuring circuitry.

The output of amplifier 51 is also directed through lead 52 to a voltage divider, made up of resistors 53 and 54, the output of which, represented by curve 59 in FIG. 5, is applied to one input of each of a pair of comparators 57 and 58. Comparators 57 and 58 also have applied to their inputs the positive and negative reference voltages respectively, over leads 41 and 37, as shown. In addition, the output of amplifier 51, as represented by curve 55 of FIG. 5, is applied to one input of each of a pair of comparators 63 and 64, whose other inputs have applied thereto the positive and negative reference voltages over leads 41 and 37, respectively.

The outputs of comparators 57 and 58 are applied to a flip-flop circuit 61, whose output is used to control switch 39. Where the input waveform 59 (FIG. 5) to comparator 57 equals or is greater than the positive reference voltage on lead 41, the comparator 57 produces an output to set the flip-flop 61 and in turn activate switch 39 so that contactor 43 engages contact 38, and the negative reference voltage is applied to amplifier 46. Conversely, if the input waveform 59 (FIG. 5) equals or is more negative than the input on lead 37 to comparator 58, comparator 58 generates a signal to reverse the flip-flop 61 and hence switch 39, thereby applying the positive reference voltage to amplifier 46. Through the action just described, the waveform 45 of FIG. 5 is generated and applied to difference amplifier 48.

It can be seen that the circuitry thus far described monitors the charging of the capacitance of conductors 7 until the charge reaches a specified reference level, then causes the capacitance to discharge and recharge in the opposite direction to a specified reference level. In order to obtain a proper evaluation of the change in capacitance, it is desirable to monitor the time span of the charging and discharging cycles. This is accomplished in the arrangement of FIGS. 3 and 4 by comparators 63 and 64 and associated circuitry.

As described previously, the output of buffer amplifier 51 follows the charging and discharging of the capacitance of the conductor pair 7, the resulting waveform being represented by curve 55 of FIG. 5, and applies its output to the comparators 63 and 64. The outputs of comparators 63 and 64 are applied to the two inputs of a NOR gate 67, as shown. Absent any signal to either of its inputs, NOR gate 67 supplies a true or on signal in a known manner, but when a signal appears at either input, the gate shuts, or otherwise indicates an off condition. When the signal applied to comparator 63 from amplifier 51 is less than that on lead 41, comparator 63 produces no output. In like manner, when the signal from amplifier 51 to comparator 64 is greater than that on lead 37, comparator 64 produces no output. Under these conditions, NOR gate 67 gives an on indication. However, when the input to comparator 63 from amplifier 51 equals or exceeds the signal on lead 41, comparator 63 produces an output which switches NOR gate 67 off. By the same token, when the signal from amplifier 51 to comparator 64 equals or is less than that on lead 37, comparator 64 produces an output which turns gate 67 off. Thus when waveform 55 of FIG. 5 is applied to comparators 63 and 64, the resulting output of NOR gate 67 is represented by waveform 68 of FIG. 5, with the length or duration of the charging cycle being given by the on period T. It can be appreciated that as the cable is filled, the period T will increase, due to the increased capacitance and hence the increased charging and discharging times, which decreases the slopes of waveforms 55 and 59.

In FIG. 4 it can be seen that the output of NOR gate 67 is applied to one input of an AND gate 69, whose other input has clock signals applied thereto from a crystal oscillator clock 70. The output of gate 69 is applied to a binary counter 71. It can be seen that during each period T of waveform 68 of FIG. 5, i.e., when NOR gate 67 is giving a true or on indication, a series of digital pulses at the clock frequency are applied to counter 71, which counts the pulses and outputs to a shift register 72 binary numbers indicative of the length of the period T. A timing and control circuit 73 which receives signals over lead 65 from flip-flop 61 resets counter 71 at each change of condition of flip-flop 61, and at the same time empties shift register 72 in a serial data stream to a variable modulus divider 74. Thus the counting cycle of counter 71 is made to coincide with the charging and discharging cycles of the capacitance being monitored. Further, the actual count itself indicates the length of the charging or discharging cycle, and changes (increases) as the filling operation progresses.

Variable modulus divider 74 receives an input from clock 70 as well as from shift register 72, and produces a pair of output frequencies, such as 6.25 KHZ and 5.68 KHZ, one of which represents binary 1's of the signal from the shift register and the other of which represents binary 0's of the same signal. The output of divider 74 is passed through a low pass filter 76 to the rotatable, coupling coil 12 as signals indicative of the charging capacitance of conductors 7.

At this stage of the operation of the monitoring system illustrated in FIG. 1, there have been created audio frequency signals which indicate the changing capacitance of conductors 7 as the filling operation progresses. In a like manner, similar signals will have been generated by the circuitry of transmitter 21 to indicate the changing capacitance of conductors 18. It is possible to operate with these signals to achieve the desired comparisons and hence a measure of the filling effectiveness in a number of ways. The remaining circuitry of FIG. 4 illustrates one arrangement for achieving the desired results.

The audio frequency signals in coil 12 are picked up by coil 13 and applied via leads 16 to a band pass filter 77. Filter 77 functions to pass those frequencies indicative of the capacitance and capacitance changes of conductors 7. A similar filter in receiver 24 passes only those frequencies indicative of the capacitance and capacitance changes of conductors 18.

The filtered signal is applied to a converter 78 which generates a voltage output having a magnitude determined by which frequency (6.25 KHZ or 5.68 KHZ) is applied to its input. The output of the converter is applied to a voltage comparator 79 which generates a binary number indicative of which voltage was received at its input, and its binary output is applied to a shift register 81. The comparator 79 and the shift register 81 continuously receive the asynchronous serial data transmission from the transmitter.

The output of comparator 79 is also applied to a synchronization logic circuit 83 which recognizes when a complete signal word is present in shift register 81 and signals a data latch circuit 82, connected to the output of register 81, to store the word. The latch circuit then generates a read command signal which is applied through lead 85 to computer 26, and the computer reads and stores the signal input from the latch circuit applied over leads 86. The binary signals received by computer 26 over leads 86 are indicative of the capacitance change between conductors 7 as the filling operation progresses. Footage counter 4 (FIG. 1) also applies signals over leads 88 to computer 26. At the same time, signals representing the capacitance change between conductors 18 are applied to the computer 26 over leads 87. The signal from counter 4 is preferably a pulse per distance indication, such as, for example, one pulse per foot of cable 1 passing over it. Counter 4 may be any one of a number of types well known in the art, such as, for example, the type shown in U.S. Pat. No. 2,783,540 of Berry, or a suitable one of the several types mentioned in column 1, lines 25 through 30 of that patent. Alternatively, counter 4 may be of a type similar to that shown in the aforementioned U.S. Pat. No. 3,733,225 of Moody.

Figure 6:
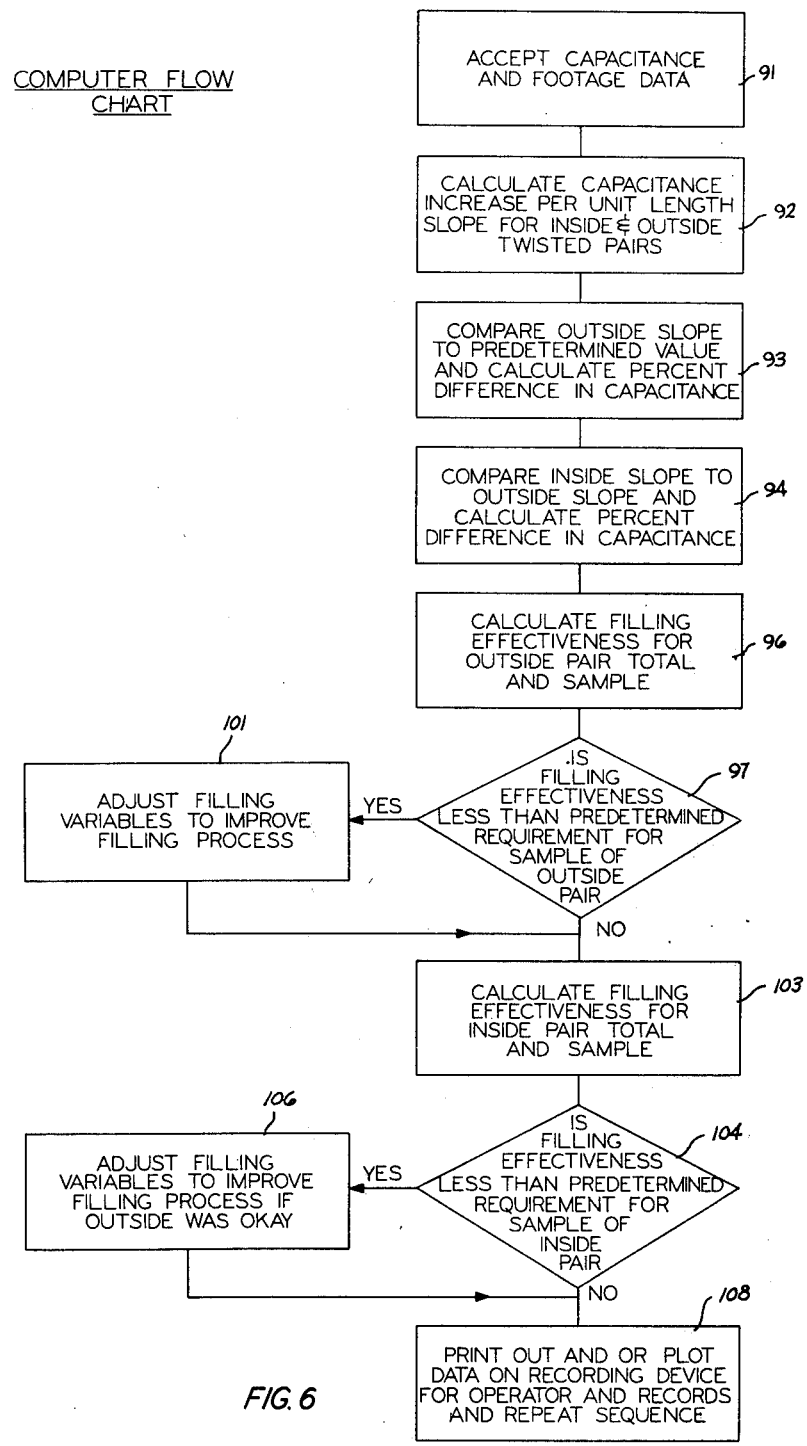
FIG. 6 illustrates a computer flow chart practiced in the invention.

The operation of the computation steps performed by computer 26 can best be understood with reference to FIG. 6, a computer flow chart. As was pointed out in the foregoing, the signals applied to coil 12, along with the footage signals, contain the necessary data for computing the filling effectiveness of the filling operation. The circuitry of receiver 17 (FIG. 4) is designed to prepare this information for use by computer 26, but it is to be understood that the following operations could be performed by means other than a computer, if desired.

In the flow chart of FIG. 6, box 91 represents the data inputs to computer 26. The computer 26 then determines the increase of capacitance per unit lengths of cable 1 processed, or the slope, for the outside twisted pair of conductors 7 and for the inside twisted pair of conductors 18, by dividing the change of capacitance by the change of processed footage of filled cable, as shown in box 92 of FIG. 6.

The computer 26 then compares the derived slope of the capacitance of the outside pair of twisted conductors 7 to a predetermined slope value and calculates the percent difference in capacitance between the two, if any. The predetermined slope value is figured on the basis of a filled cable having an average mutual capacitance of 83 nanofarads per mile of length. This is shown as box 93 of FIG. 6.

The computer 26 also performs the same computations with respect to the inside pair of twisted conductors 18, to determine the percent difference in capacitance, but comparing with the outside pair capacitance slope value, as shown as box 94 of FIG. 6.

The computer 26 then is used to determine or calculate the filling effectiveness for the outside pair of twisted conductors 7, as shown as box 96 of FIG. 6.

The filling effectiveness is determined from the mutual capacitance difference, and is a function of two significant variables. The first variable to be considered is the geometric spacing of the two insulated conductors 7 with respect to each other and with respect to the other insulated conductors 6 in the cable 1. The second variable is the dielectric constant of the insulating material surrounding the conductors and entering the interstices therebetween.

However, from a practical standpoint, it may be assumed that the variable of the geometric spacing will remain relatively constant throughout the cable filling process, and so may be assumed constant in the computations. This, then, leaves the dielectric constant of the insulating material surrounding the conductors to be taken into consideration, but must be computed in terms of mutual capacitance.

The filling effectiveness, as mentioned earlier, is defined as an indication of the fillable cross-sectional area which has been filled with waterproofing compound as compared to the total cross-sectional area that could be filled to result in 100% fill.

Further, the portion of fillable area filled with the compound relative to the total fillable area is a function of the dielectric constant of the total fillable area.

Thus, the filling effectiveness may be determined by using the following equation:

$$\text{Filling Effectiveness} = \left[1 - \frac{(E_F - E_{PJ})(1 + 2 E_{PJ})}{\frac{(E_F + 2E_{PJ})(1 - E_{PJ})}{2}}\right]100\%$$

Where:
$E_F$ = Dielectric Constant of Fillable Area of Cable
$E_{PJ}$ = Dielectric Constant of Pure Filling Compound.

Then by measuring the change of this dielectric constant the amount of filling compound which has been added may be determined.

However, this change cannot be measured directly, but an equation must be used which relates this change to total change in mutual capacitance, which can be measured. Such an equation is:

$$\Delta E_F = \frac{\Delta E (RE_{F_{Max}} - RE_I + E_I - E_{F_{Min}})}{(E_I - RE_I)}$$

Where:
$E_{F_{Max}}$ = Maximum value of E for 100% filled
$E_{F_{Min}}$ = Air ≈ 1.00
E = Overall dielectric constant
$E_I$ = Dielectric constant of insulation on conductors $$R = \frac{\text{Mutual capacitance with no fill}}{\text{Mutual capacitance with 100\% fill}}.$$

If the value, or equation, for $E_F$ is substituted in the equation set forth previously, it will be possible to solve for the filling effectiveness.

However, the first set forth equation may be further simplified, using a specific type of cable.

As an example, in testing one type of cable in manufacture, such as polypropylene insulated conductors and the cable having a mutual capacitance of 83 nanofarads per mile, the equation will be:

$$\text{Filling Effectivness} = 100 - 50\left[\frac{1}{\frac{19.4}{\%\Delta E} - .224}\right]\%$$

Where:
ΔE = Difference in capacitance between the outside pair and a predetermined value or difference in inside and outside capacitances (Boxes 93 and 94, FIG. 6).

With the cable of the present example, the percent ΔE is limited to the range 0–16.

All of the above computations are indicated as being performed in boxes 96 and 103, FIG. 6.

Figure 7:
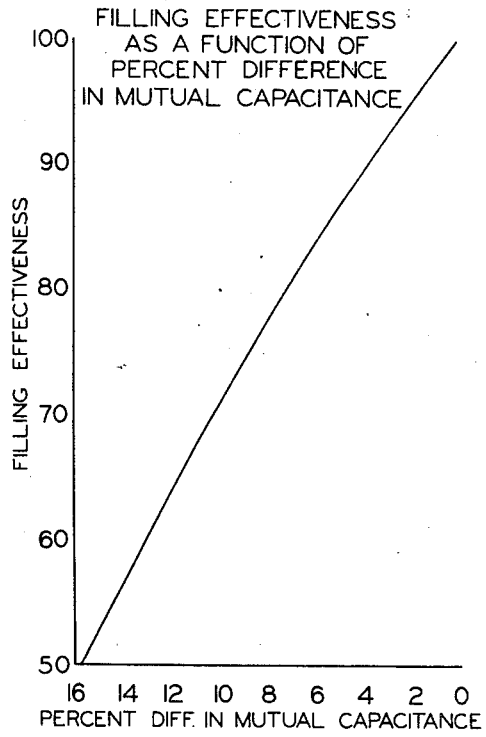
FIG. 7 illustrates a graph of filling effectiveness for a particular type of cable.

FIG. 7 is a curve illustrating the above equation for filling effectiveness as a function of the percent difference in mutual capacitance, for the type of cable mentioned above.

As mentioned previously, under normal operating conditions it is assumed that the outer twisted pair of conductors 7 receive 100% fill. If this is in fact occurring when the slope is calculated in box 93, FIG. 6, the filling effectiveness will be calculated with the resultant calculation being equal to a maximum 100% in box 96. However, if this does not occur the filling effectiveness will be calculated, box 96, FIG. 6. If the result is less than the predetermined value the computer 26 will supply signals over a pair of leads 98, FIG. 1, to control a valve 99 in the filling chamber 3 to increase the pressure of the filling compound to attempt to reach the predetermined fill condition on the outer twisted pair of conductors 7. Such is shown as box 101 in FIG. 6. The valve 99 may be a digital flow valve such as Model 6-607D of Digital Dynamics, Inc. of Sunnyvale, Cal.

Further, the computer 26 also may signal over a pair of leads 102, FIG. 1, to increase the temperature to the filling chamber 3 to cause the filling compound to be less viscous. Still further it is possible for the computer to generate signals for controlling drive means 10 through leads 110 to alter the line speed of the advancing cable 1.

Obviously, the computer 26 may generate signals to control either one, or combination, or all of the above mentioned variables, as it is continuously monitoring the relative filling effectiveness.

The computer 26 also calculates the filling effectiveness on the inside twisted pair of conductors 18, using the equations set forth above, as shown in box 103, FIG. 6. The calculated value may not be the same as calculated for the outside twisted pair of conductors 7 (box 96, FIG. 6), as the slopes may be different (see boxes 93 and 94, FIG. 6).

In the event that the calculated value is determined to be less than a predetermined requirement as determined in box 104, FIG. 6, the computer 26 will generate signals to control the variables, box 106, FIG. 6. These signals will be similar to those generated in box 101, FIG. 6, to similarly control the pressure or temperature of the filling compound or the line speed of the cable 1.

During the operation of the equipment the computer 26 will send signals over a pair of leads 107 to cause the results of the continuous monitoring of the filling effectiveness to be recorded on a recording device 108. The recording may be a series of actual value readings on a print-out with corresponding footage values of filled cable core 1, or may be a plotting of data and footage, such as that calculated in the boxes 96 and 103, FIG. 6.

In the alternative, it is possible to obtain the filling effectiveness of the cable, but not as precisely as described above, by measuring the capacitance change of a single twisted pair of conductors, preferably near the center of the cable, such as the twisted pair 18. The signals indicative of such capacitance would be handled in a manner similar to that described above and placed in the computer 26. The computer 26 would also have a standard capacitance change stored therein for the particular type of cable being filled, and would process the measured change as by using boxes 93, 96, 97, 101, and 108, FIG. 6.

It is to be understood that the above-described arrangements are simply illustrative of the principles of the invention. Other arrangements may be devised by those skilled in the art which will embody the principles of the invention and fall within the spirit and scope thereof.

What is claimed is:

1. A method of monitoring the amount of fill being placed in a cable as the cable is advanced through a filling chamber, which comprises the steps of continuously monitoring the changing capacitance of a twisted pair of conductors in the cable, and comparing the monitored changes in capacitance to a predetermined standard value of capacitance change.

2. A method of measuring the filling effectiveness of the filling operation in the manufacture of waterproof cables having a plurality of conductors therein, which comprises the steps of:
   continuously monitoring the change in capacitance of an outer pair of conductors as the cable passes through a filling chamber,
   continuously monitoring the change in capacitance of an inner pair of conductors as the cable passes through the filling chamber, and
   comparing the monitored changes in capacitance of the outside pair and the inside pair with each other to ascertain the filling effectiveness of the filling operation.

3. The method according to claim 1, and further including the step of providing an indication of the location along the cable length of regions where deviations in filling effectiveness occur.

4. The method according to claim 1, and further including the step of comparing the monitored capacitance change of the outer pair of conductors to a predetermined reference value.

5. Apparatus for measuring the filling effectiveness of the filling operation in the manufacture of waterproof cables having a plurality of conductors comprising:
   first means for continuously measuring the change in capacitance of an outer pair of conductors in the cable as it passes through a filling chamber,
   second means for continuously measuring the change in capacitance of an inner pair of conductors in the cable as it passes through said filling chamber, and
   means associated with said first and second means for generating signals indicative of the changes in capacitance of the conductors as the changes occur.

6. Apparatus according to claim 5 and further comprising:
   means for determining the filling effectiveness including means for comparing the change in capacitance of the outer pair of conductors to the change in capacitance of the inner pair of conductors.

7. Apparatus for measuring the filling effectiveness of the filling operation in the manufacture of waterproof cables having a plurality of conductors comprising:
   means including a voltage source for continuously charging and discharging the capacitance of a pair of the conductors between upper and lower voltage limits;
   comparator means responsive to the charge on the capacitance reaching a charging limit for generating a signal to reverse the voltage applied to the capacitance;
   second comparator means for providing an indication when the charge on the capacitance exceeds the upper and lower voltage limits;
   means for generating a pulse train in the absence of such an indication from said second comparator means; and means for counting the pulses generated between such indications, the number of pulses indicating the charging and discharging times of the capacitance.

8. Apparatus according to claim 7, wherein the pair of conductors is a first pair of conductors, and further including:
means for continuously charging and discharging the capacitance of a second pair of conductors between upper and lower voltage limits;
third comparator means responsive to the charge on the capacitance of the second pair of conductors reaching a charging limit for generating a signal to reverse the voltage applied to the capacitance;
fourth comparator means for providing an indication when the charge on the capacitance of the second pair of conductors exceeds the upper and lower voltage limits;
means for generating a second pulse train in the absence of such an indication from said fourth comparator means; and
means for counting the pulses generated between such indications, the number of pulses indicating the charging and discharging times of the capacitance of the second pair of conductors.

9. Apparatus according to claim 8 and further including:
means for converting the pulses into signals indicative of the changing capacitance of the first pair of conductors and of the second pair of conductors, and
means for comparing the signals representative of the changing capacitance of the first pair of conductors to the signals representative of the changing capacitance of the second pair of conductors for determining the filling effectiveness of the filling operation.

10. Apparatus according to claim 9 wherein said last-mentioned means includes means providing an indication of deviations in filling effectiveness.

11. Apparatus according to claim 10 and further including means for monitoring the cable travel through a filling chamber to provide an indication of where along the cable length deviations in filling effectiveness occur.

* * * * *